United States Patent
Towfiq et al.

(10) Patent No.: US 12,323,227 B2
(45) Date of Patent: Jun. 3, 2025

(54) ENCLOSURE FOR TESTING ELECTRONIC DEVICES

(71) Applicant: Promptlink Communications, Inc., Oceanside, CA (US)

(72) Inventors: Foad Towfiq, Vista, CA (US); Mohammad Ostadkar, Oceanside, CA (US); Adib Towfiq, Oceanside, CA (US)

(73) Assignee: Promptlink Communications, Inc., Oceanside, CA (US)

( * ) Notice: Subject to any disclaimer, the term of this patent is extended or adjusted under 35 U.S.C. 154(b) by 0 days.

(21) Appl. No.: 18/370,334

(22) Filed: Sep. 19, 2023

(65) Prior Publication Data
US 2024/0235708 A1  Jul. 11, 2024

Related U.S. Application Data

(63) Continuation of application No. 17/328,927, filed on May 24, 2021, now Pat. No. 11,791,919, which is a
(Continued)

(51) Int. Cl.
| | |
|---|---|
| *H04H 20/12* | (2008.01) |
| *G01R 1/04* | (2006.01) |
| *G01R 1/067* | (2006.01) |
| *G01R 1/073* | (2006.01) |
| *G01R 1/18* | (2006.01) |
| *G01R 29/08* | (2006.01) |
| *G01R 31/28* | (2006.01) |
| *H04B 17/00* | (2015.01) |

(Continued)

(52) U.S. Cl.
CPC ......... *H04H 20/12* (2013.01); *H04B 17/0085* (2013.01); *H04B 17/16* (2015.01); *H04H 60/32* (2013.01); *H04L 43/50* (2013.01); *G01R 1/04* (2013.01); *G01R 1/18* (2013.01)

(58) Field of Classification Search
CPC .......... G01R 1/04; G01R 1/067; G01R 1/073; G01R 1/18; G01R 29/08; G01R 31/28
See application file for complete search history.

(56) References Cited

U.S. PATENT DOCUMENTS

| 2,244,679 A | 6/1941 | Harry |
| 4,217,012 A | 8/1980 | Klaus |
(Continued)

FOREIGN PATENT DOCUMENTS

| CN | 205793943 U | 12/2016 |
| KR | 10-1705821 B1 | 2/2017 |

OTHER PUBLICATIONS

Office Action received for Mexican Patent Application No. MX/a/2020/004126, mailed on Jul. 5, 2023, 3 pages (Official Copy Only) See Communication Under Rule 37 CFR § 1.98(a) (3).

(Continued)

*Primary Examiner* — Neel D Shah
(74) *Attorney, Agent, or Firm* — DLA Piper LLP (US)

(57) ABSTRACT

Various devices and techniques help to reduce the entry of unwanted radio waves into an enclosure and reduce the reflection of radio waves inside the enclosure. Such devices and techniques enable a test environment inside the enclosure that provides high-quality functionality and performance testing.

20 Claims, 11 Drawing Sheets

Related U.S. Application Data continuation of application No. 16/159,402, filed on Oct. 12, 2018, now Pat. No. 11,018,785.

(60) Provisional application No. 62/573,081, filed on Oct. 16, 2017.

(51) Int. Cl.
  *H04B 17/16* (2015.01)
  *H04H 60/32* (2008.01)
  *H04L 43/50* (2022.01)

(56) References Cited

U.S. PATENT DOCUMENTS

| | | | |
|---|---|---|---|
| 4,583,517 | A | 4/1986 | Hilton et al. |
| 4,817,337 | A * | 4/1989 | Lahita .............. E06B 7/2314 174/384 |
| 5,165,985 | A | 11/1992 | Wiste et al. |
| 5,255,970 | A | 10/1993 | Theosabrata |
| 5,314,732 | A | 5/1994 | Wiste |
| 6,534,706 | B1 * | 3/2003 | Rapp .............. H05K 9/0016 174/375 |
| 9,774,409 | B1 | 9/2017 | Lee et al. |
| 11,018,785 | B2 | 5/2021 | Towfiq et al. |
| 2005/0118366 | A1 | 6/2005 | Piemonte et al. |
| 2009/0278703 | A1 | 11/2009 | Iglesias |
| 2013/0277101 | A1 | 10/2013 | Judy |
| 2014/0187172 | A1 | 7/2014 | Partee |
| 2014/0187173 | A1 | 7/2014 | Partee |
| 2016/0053536 | A1 | 2/2016 | Craney |
| 2019/0331719 | A1 | 10/2019 | Cummings |
| 2021/0281337 | A1 | 9/2021 | Towfiq et al. |

OTHER PUBLICATIONS

Decision to Grant received for European Patent Application No. 18867828.8, mailed on Jul. 14, 2022, 2 pages.
Extended European Search Report received for European Patent Application No. 22189344.9, mailed on Dec. 22, 2022, 7 pages.
Intention to Grant received for European Patent Application No. 18867828.8, mailed on Mar. 23, 2022, 8 pages.
Office Action received for Canadian Patent Application No. 3079204, mailed on Aug. 17, 2021, 3 pages.
Extended European Search Report received for European Patent Application No. 18867828.8, mailed on Jun. 8, 2021, 8 pages.
International Preliminary Report on Patentability received for PCT Patent Application No. PCT/US2018/055725, mailed on Apr. 30, 2020, 7 pages.
International Search Report and Written Opinion received for PCT Patent Application No. PCT/US2018/055725, mailed on Dec. 10, 2018, 9 pages.
Non-Final Office Action received for U.S. Appl. No. 16/159,402, mailed on May 21, 2020, 14 pages.
Non-Final Office Action received for U.S. Appl. No. 17/328,927, mailed on Dec. 2, 2022, 9 pages.
Notice of Allowance received for U.S. Appl. No. 16/159,402, mailed on Jan. 26, 2021, 12 pages.
Notice of Allowance received for U.S. Appl. No. 17/328,927, mailed on Jun. 7, 2023, 8 pages.

* cited by examiner

ENCLOSURE FOR TESTING ELECTRONIC DEVICES

CROSS-REFERENCE TO RELATED APPLICATIONS

This application is a continuation of U.S. application Ser. No. 17/328,927, entitled "ENCLOSURE FOR TESTING ELECTRONIC DEVICES" filed May 24, 2021 which is a continuation of U.S. application Ser. No. 16/159,402, entitled "ENCLOSURE FOR TESTING ELECTRONIC DEVICES" filed Oct. 12, 2018, which claims priority to U.S. Provisional Patent Application No. 62/573,081, entitled "ENCLOSURE FOR TESTING ELECTRONIC DEVICES," filed on Oct. 16, 2017, the contents of which are hereby incorporated by reference in its entirety.

FIELD

The present disclosure relates generally to enclosures, and more specifically to techniques for testing electronic devices.

BACKGROUND

Service providers provide customers (e.g., subscribers) with services, such as multimedia, audio, video, telephony, data communications, wireless networking, and wired networking. Service providers provide such services by deploying one or more electronic devices at their customers' premises, and then connecting the deployed electronic device to the service provider's network or infrastructure. The deployed electronic devices are often called Customer Premise Equipment (CPE). For example, a cable company delivers media services to customers by connecting an electronic device, such as a set-top box or a cable modem, located at customer's premise to the cable company's network. This CPE is the device that the service provider uses to deliver the service to the customer. Under some circumstances, it is beneficial to test devices for functionality and/or performance.

BRIEF SUMMARY

Some techniques for testing electronic devices, however, are unreliable or inaccurate. For example, some techniques for testing wireless devices produce inaccurate results because unintended radio waves enter the enclosure in which the electronic device is being tested. For another example, some techniques for testing wireless devices produce inaccurate results because radio waves produced in the enclosure reflect inside the enclosure, causing undesired effects, such as interference or a standing wave.

Accordingly, the present techniques provide devices for more reliably and more accurately testing electronic devices for functionality and/or performance.

In accordance with some embodiments, an enclosure for testing electronic devices is described. The enclosure comprises: a first interior door guide; a second interior door guide; a first exterior door guide; a second exterior door guide; a retractable door, wherein the retractable door includes: an interior door element slidably engaging the first interior door guide and the second interior door guide, and an exterior door element slidably engaging the first exterior door guide and the second exterior door guide; and wherein the interior door element and the exterior door element are configured to retract in unison.

In accordance with some embodiments, an enclosure for testing electronic devices is described. The enclosure comprises: a first surface and a second surface, wherein the first surface has port that provides a point of connection or a point of entry from outside the enclosure to inside the enclosure; a flexible container positioned adjacent to the first surface, the flexible container including a plurality of static shielding material pieces.

In accordance with some embodiments, an enclosure for testing electronic devices is described. The enclosure comprises: a plurality of static shielding strips, each static shielding strip having a respective first end and a respective second end; wherein respective first ends of a set of strips of the plurality of static shielding strips are connected; and wherein respective second ends of the set of strips of the plurality of static shielding strips are not connected.

DESCRIPTION OF THE FIGURES

For a better understanding of the various described embodiments, reference should be made to the Description of Embodiments below, in conjunction with the following drawings in which like reference numerals refer to corresponding parts throughout the figures.

DESCRIPTION OF EMBODIMENTS

The following description sets forth exemplary methods, parameters, and the like. It should be recognized, however, that such description is not intended as a limitation on the scope of the present disclosure, but is instead provided as a description of exemplary embodiments.

Figure 1A:
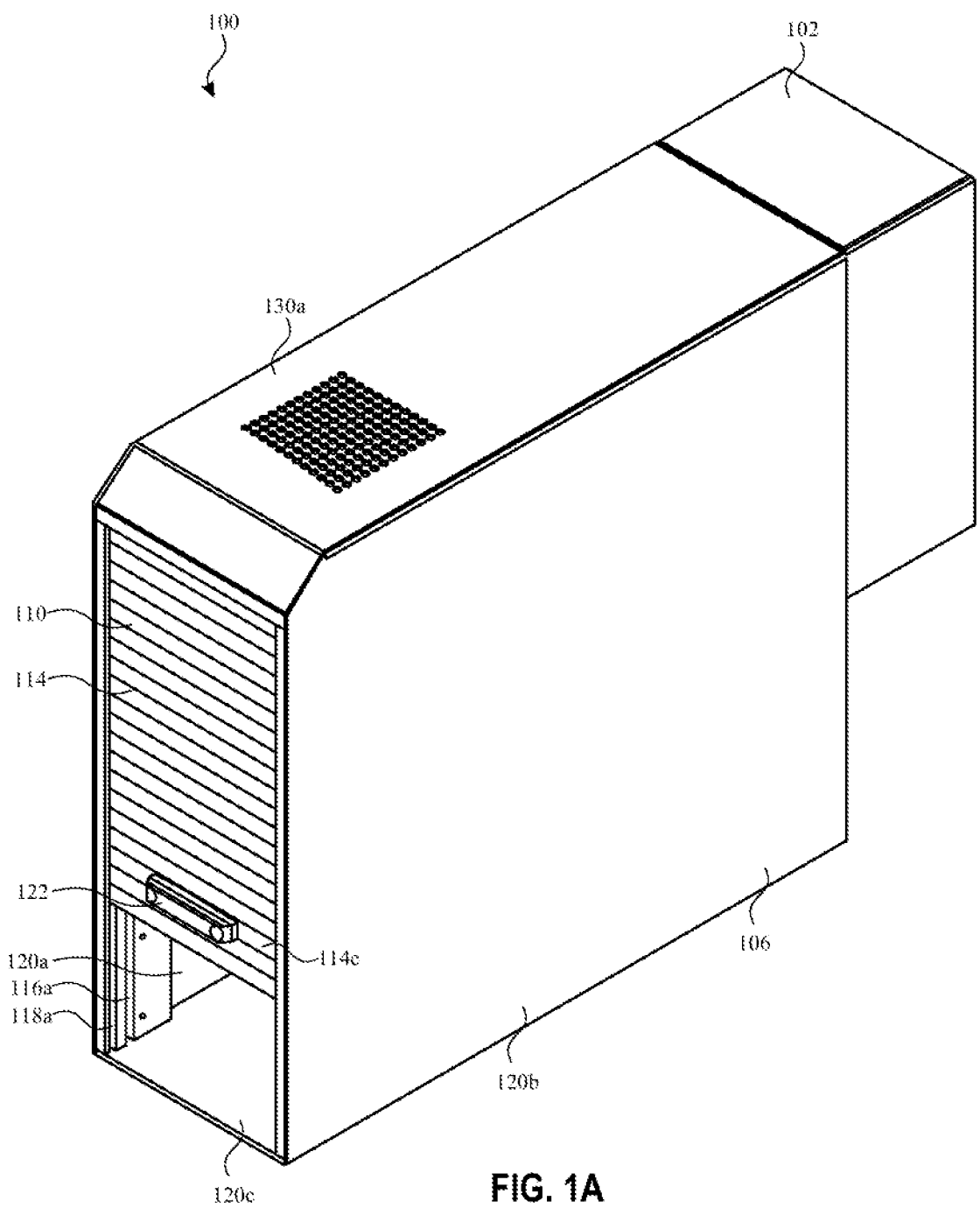
FIGS. 1A-1B illustrate various views of an exemplary enclosure in accordance with some embodiments.
Figure 1B:
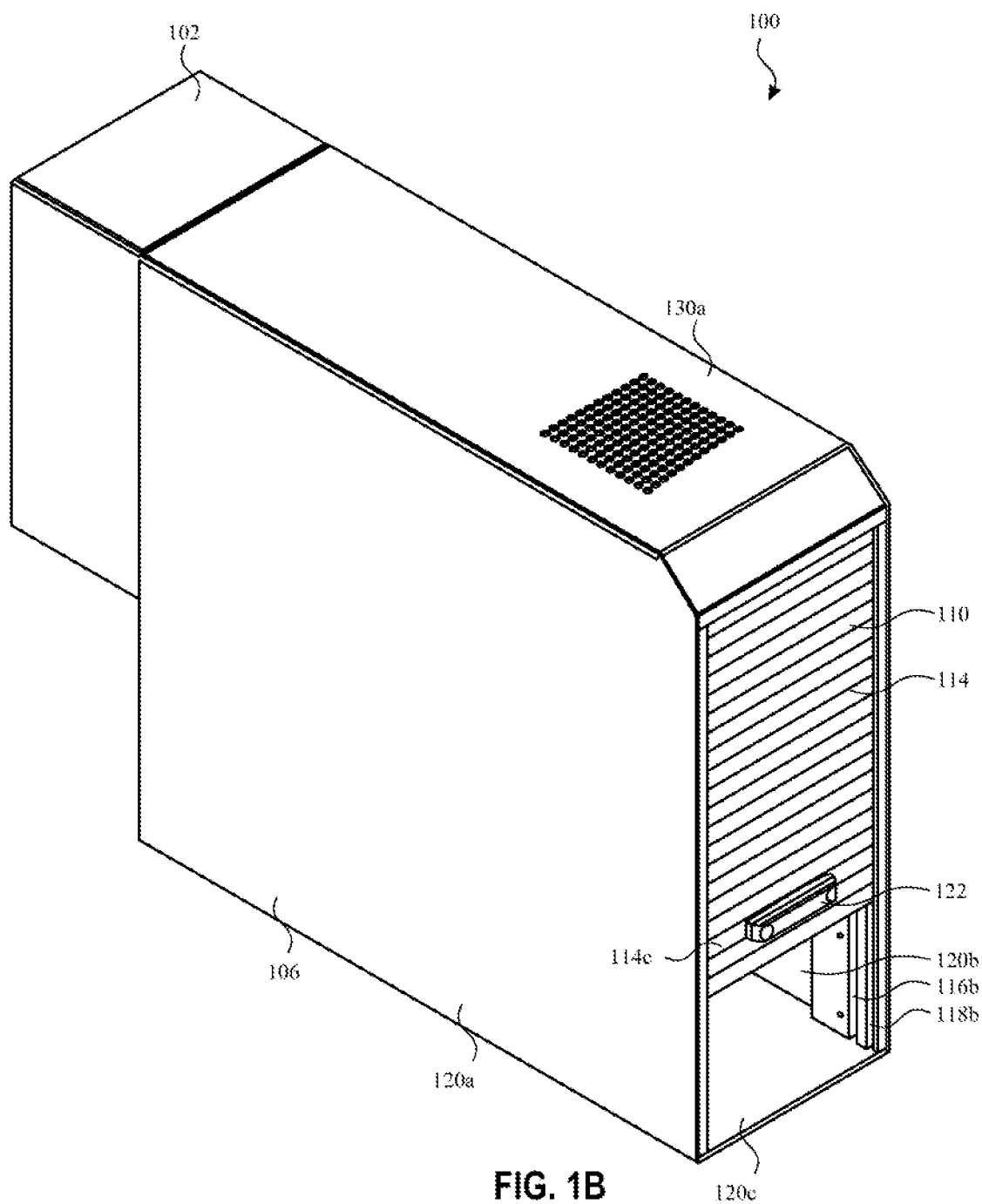

FIG. 1 illustrates exemplary enclosure 100 for testing electronic devices in accordance with some embodiments. Generally, an electronic device, sometimes referred to as a device under test, is placed inside enclosure 100. For example, a technician opens retractable door 110 of enclosure 100, places the electronic device inside enclosure 100, and subsequently closes retractable door 110. Examples of electronic devices to be tested include WLAN devices (e.g., WLAN access point, WLAN client device), short-range communication radio devices (e.g., a device enabled with Bluetooth®), and the like. Enclosure 100 may be used to test the wireless functionality or performance of the electronic device.

To test the functionality or performance of the electronic device, an antenna of a control device is placed inside enclosure 100 (e.g., prior to placing the device under test inside enclosure 100). In some examples, the control device is also placed inside enclosure 100. An example of a control device includes a wireless device, such as a WLAN device in a client mode, that is pre-programmed to wirelessly communicate with the device under test to run one or more test sequences. Another example of a control device includes a wireless device, such as a WLAN device in a client mode, that is in wireless communicate with the device under test and that is controlled by a remote computer to run one or more test sequences. Thus, in some examples, the control device is a wireless control device for conducting testing of wireless electronic devices.

As illustrated in FIGS. 1-4, retractable door 110 includes interior door element 112 and exterior door element 114. Interior door element 112 is slidably engaged with first interior door guide 116a (e.g., a channel, on an interior of a first side 120a of the enclosure) and second interior door guide 116b (e.g., a channel, positioned parallel to the first interior door guide, positioned opposite the first interior door guide, on an interior of a second side 120b of enclosure 100). The first side 120a of enclosure 100 is substantially parallel to the second side 120b of enclosure 100. Exterior door element 114 is slidably engaged with first exterior door guide 118a (e.g., a channel, positioned adjacent to the first interior door guide, on the interior of the first side 120a of the enclosure) and second exterior door guide 118b (e.g., a channel, positioned parallel to the first exterior door guide, positioned opposite the exterior interior door guide, on the interior of the second side 120b of enclosure 100). Interior door element 112 and exterior door element 114 are configured to retract (and extend or unretract) in unison. In some embodiments, the retractable door is configured to retract and unretract without the use of wheels.

Figure 2:
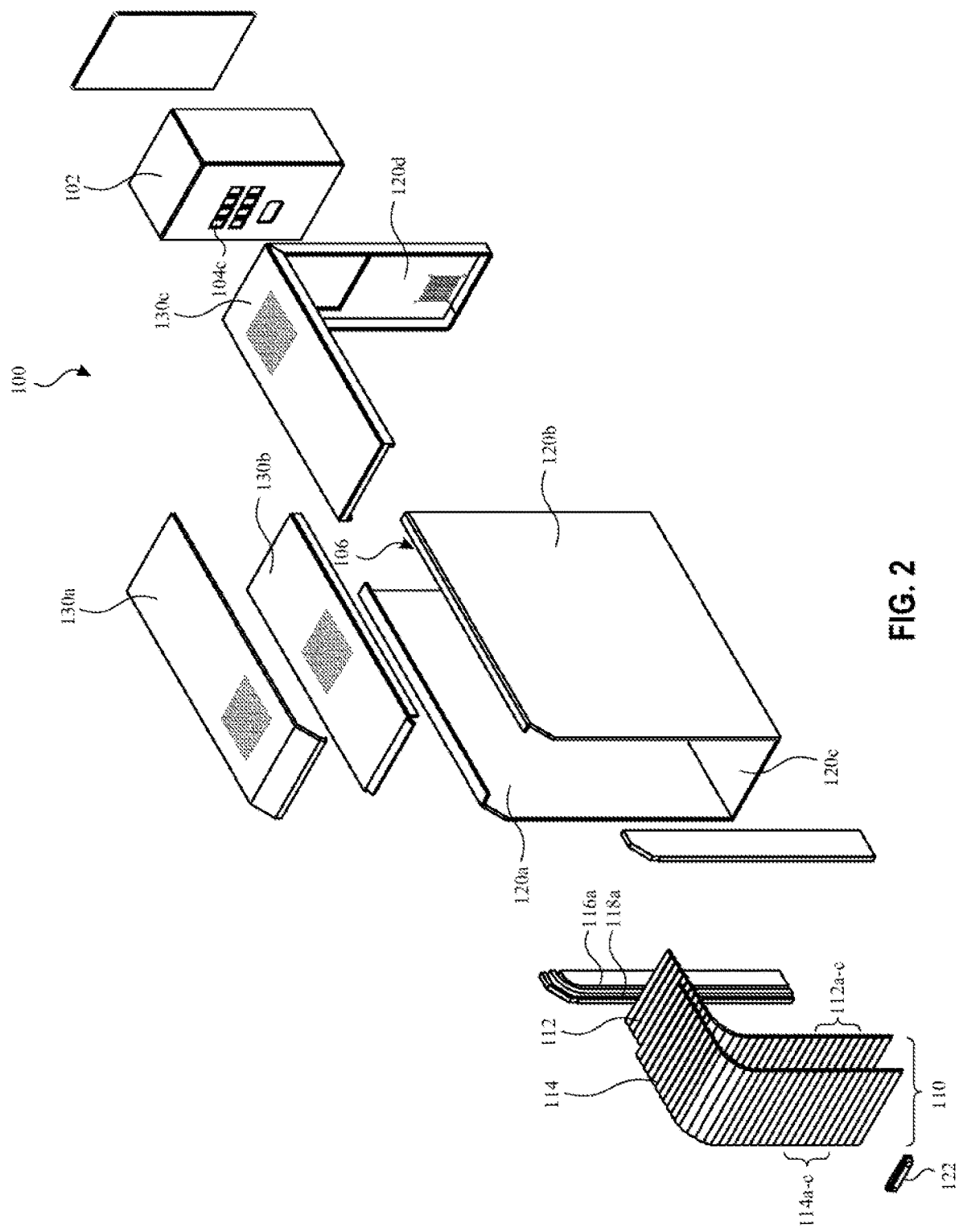
FIG. 2 illustrates an exploded view of an exemplary enclosure in accordance with some embodiments.
Figure 3:
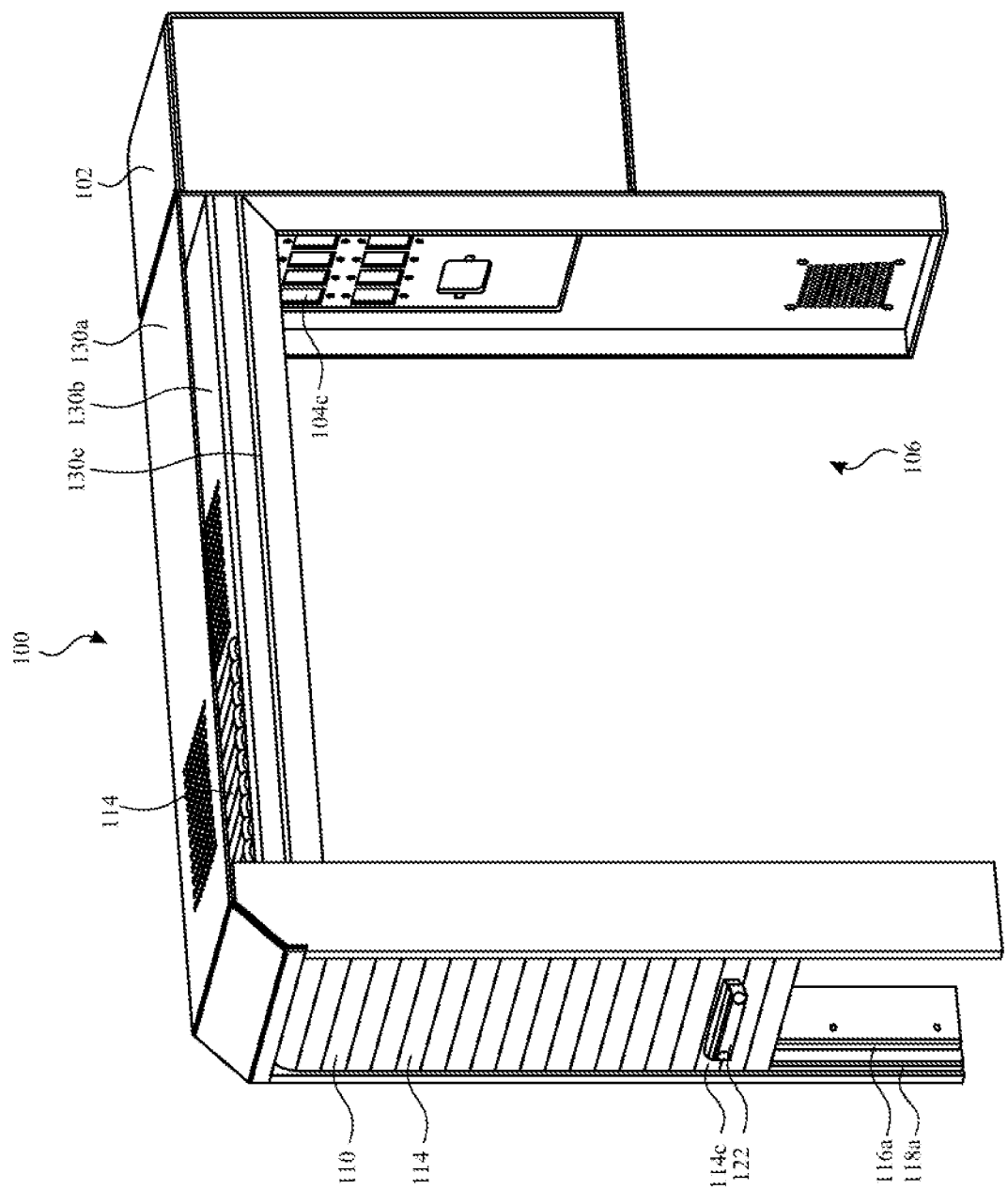
FIG. 3 illustrates a partial view of an exemplary enclosure in accordance with some embodiments.
Figure 5:
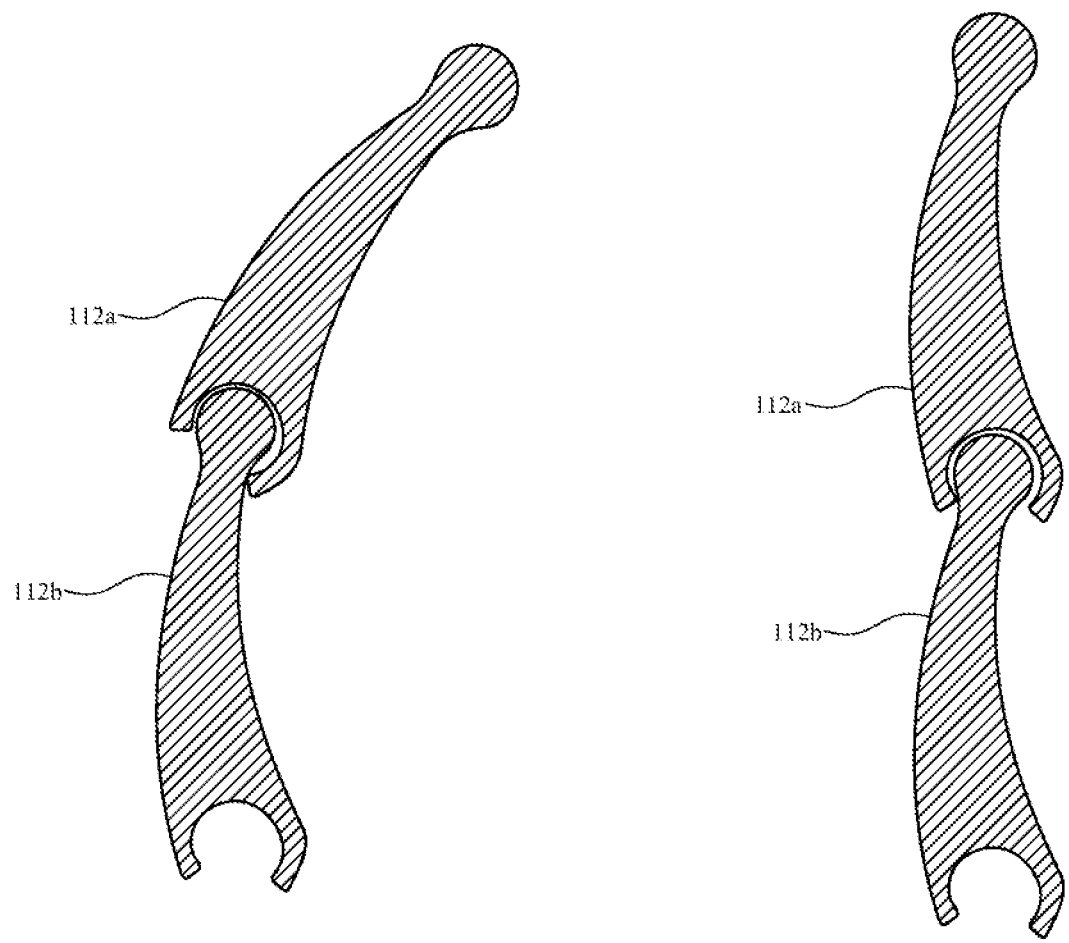
FIG. 5 illustrates cross section views of exemplary slats for a retractable door.

In some embodiments, the interior door element 112 comprises a first plurality of slats 112a-112c, as identified in FIG. 2. With reference to FIG. 5, two or more slats of the first plurality of slats are slidably interlocked (e.g., connected, slide one slat into the other to connect them). For example, a first slat 112a is interlocked with an adjacent second slat 112b, and the second slat 112b is interlocked with an adjacent third slat. For example, to separate the first slat 112a and the second slat 112b such that they are not interlocked, one of the two slats must slide with respect to the other slat in a direction that is normal to the cross section view shown in FIG. 5. The exterior door element 114 comprises a second plurality of slats 114a-114c, as identified in FIG. 2. Two or more slats of the second plurality of slats 114a-114c are slidably interlocked (e.g., connected). For example, a first slat 114a is interlocked with a second slat 114b, and the second slat is interlocked with a third slat, as illustrated with respect to slats 112a-112b in FIG. 5.

In some embodiments, two or more slats of the first plurality of slats 112a-112c are configured to rotate (e.g., more than a first amount (5 degrees) and less than a second amount (60 degrees)) with respect to respective adjacent slats of the first plurality of slats, as shown in the two views of FIG. 5. In FIG. 5, slat 112a has rotated with respect to slat 112b. In some embodiments, two or more slats of the second plurality of slats 114a-114c are similarly configured to rotate (e.g., more than a first amount (5 degrees) and less than a second amount (60 degrees)) with respect to respective adjacent slats of the second plurality of slats 114a-114c.

In some embodiments, a selected slat 112c of the first plurality of slats 112a-112c of the interior door element 112 is attached to a selected slat 114c of the second plurality of slats 114a-114c of the exterior door element 114. In some examples, no other slat of the first plurality of slats 112a-112c is attached to any other slat of the second plurality of slats 114a-114c. For example, sliding the exterior door element 114 causes the interior door element 112 to also slide because the selected slat 112c of the first plurality of slats 112a-112c is attached to the selected slat 114c of the second plurality of slats 114a-114c. In some examples, a portion of handle 122 extends through selected slat 112c the first plurality of slats and through the selected slat 114c of the second plurality of slats via holes 124 in the respective slats. Thus, in some examples, handle 122 is used to cause the interior door element 112 and the exterior door element 114 to move in unison (e.g., to retract or unretract door 110).

In some embodiments, the interior door element 112 includes a first quantity of slats (e.g., 30) and the exterior door element 114 includes a second quantity of slats (e.g., 40) that is different from the first quantity of slats. The second quantity of slats is greater than the first quantity of slats. In some examples, the slats of the interior door element 112 are substantially the same shape and made of the same material as the slats of the exterior door element 114.

Figure 6:
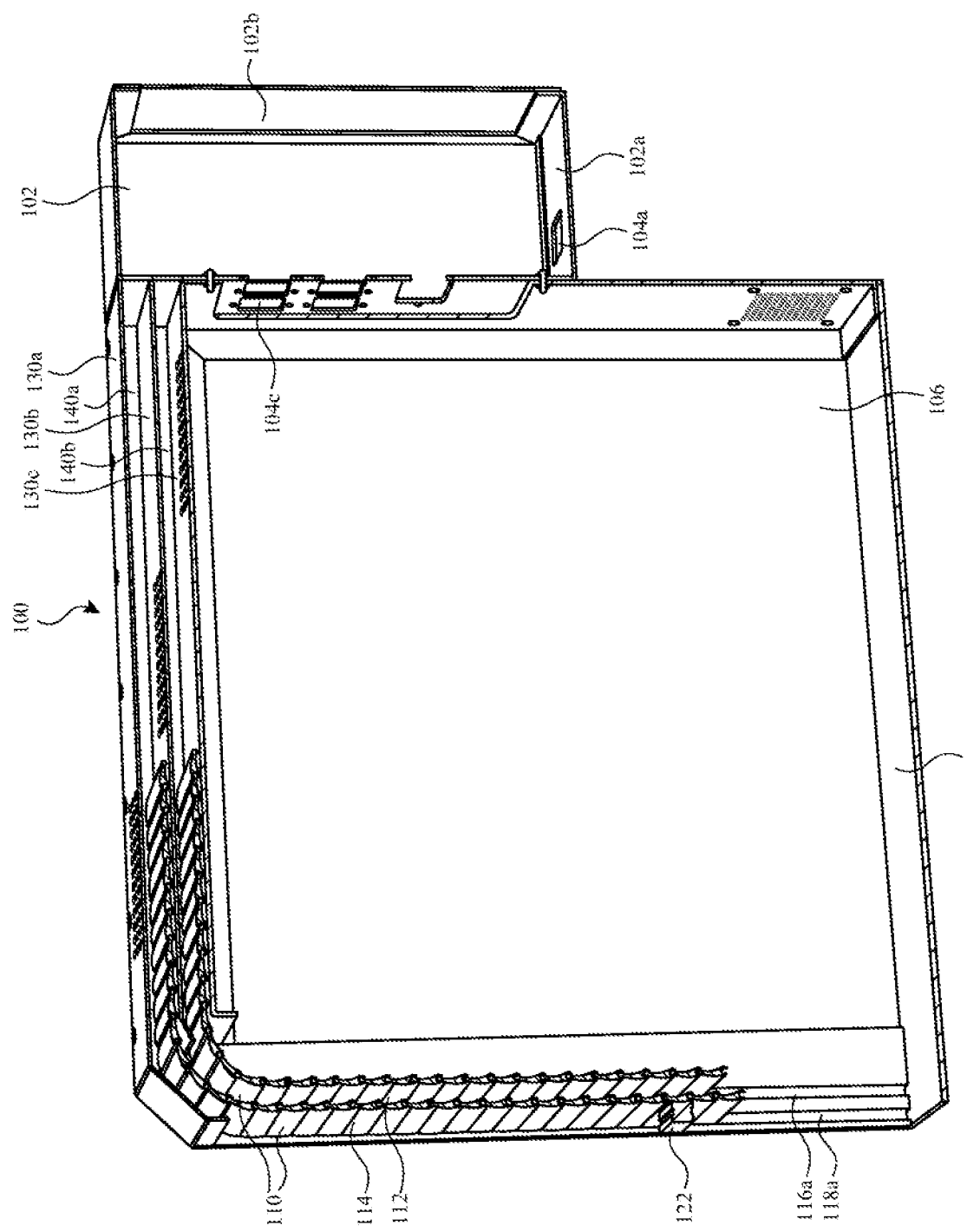
FIG. 6 illustrates a cross section view of an exemplary enclosure in accordance with some embodiments.

With reference to FIGS. 2 and 6, in some embodiments, enclosure 100 includes first element 130a (e.g., first plate, substantially flat, with a surface that is the top of the enclosure), a second element 130b (e.g., second plate, substantially flat, in the interior of the enclosure) positioned below first element 130a. The second element 130b is substantially parallel to the first element 130a. The first element 130a and the second element 130b form a first waveguide 140a (e.g., using the bottom of the first element 130a, the top of the second element 130b, and the interiors of first side 120a and second side 120b). Third element 130c (e.g., third plate, substantially flat, in the interior of the enclosure) is positioned below second element 130b. Third element 130c is substantially parallel to second element 130b. Second element 130b and third element 130c form a second waveguide 140b (e.g., using the bottom of the second element 130b, the top of the third element 130c, and the interiors of first side 120a and second side 120b), Thus, the second element 130b is positioned between the first element 130a and the third element 130c.

As illustrated in FIGS. 2 and 6, in some embodiments each of the first element 130a, the second element 130b, and the third element 130c include a plurality of ventilation holes. In some examples, the various pluralities of ventilation holes are offset from each other along an axis (e.g., X axis). For example, the various pluralities of ventilation holes are offset such that they do not overlap in the vertical axis. Thus, a first plurality of ventilation holes of first element 130a do not overlap a second plurality of ventilation holes of second element 130b. The first plurality of ventilation holes of first element 130a do not overlap a third plurality of ventilation holes of third element 130c. The second plurality of ventilation holes of second element 130b do not overlap the third plurality of ventilation holes of third element 130c. As a result, there is no line of sight from outside the enclosure to inside the second chamber 106 via the first, second, and third pluralities of ventilation holes. As a result, some radio waves that enter enclosure 100 via the first plurality of ventilation holes are dissipated in waveguide/cavity 140a and some radio waves are dissipated in waveguide/cavity 140b. In some examples, each of the first, second, and third pluralities of ventilation holes include the same quantity of holes. In some examples, each of the first, second, and third pluralities of ventilation holes are arranged in a rectangular (e.g., square) array or a circular layout.

In some embodiments, the second waveguide/cavity 140b is configured such that, when the retractable door 110 is in an unretracted position (e.g., is not retracted, is closed), the second waveguide/cavity 140b dissipates at least a portion of electromagnetic waves (e.g., radio waves) that penetrate the exterior door element 114 of the retractable door 110. This helps to prevent unwanted electromagnetic waves from interfering with wireless testing in enclosure 100.

In some embodiments, for example when the retractable door 110 is in an unretracted position (e.g., is not retracted, is closed), the first waveguide/cavity 140a is configured to dissipate some electromagnetic waves that enter the enclosure 100 and the second waveguide/cavity 140b is configured to dissipate some electromagnetic waves that enter the enclosure 100. In particular, some electromagnetic waves (e.g., radio waves) travel into the first and/or second waveguide/cavity and dissipate.

In some embodiments, when the retractable door 110 is in a retracted position (e.g., the retractable door 110 is open), a portion (e.g., some slats but not all, all slats) of exterior door element 114 is positioned between the first element 130a and the second element 130b. Similarly, when the retractable door 110 is in the retracted position, a portion (e.g., some slats but not all, all slats) of the interior door element 112 is positioned between the second element 130b and the third element 130c. In some embodiments, even when the retractable door 110 is not in a retracted position (and it is extended or unretracted, the door closed), a portion (e.g., some slats but not all, all slats) of the exterior door element 114 is positioned between the first element 130a and the second element 130b and a portion (e.g., some slats but not all, all slats) of the interior door element 112 is positioned between the second element 130b and the third element 130c.

In some embodiments, the interior door element 112 comprises aluminum and the exterior door element 112 comprises aluminum. In some embodiments, each slat (or two or more slats) of the first plurality of slats 112a-112c is made substantially of aluminum and is nickel plated. In some embodiments, each slat (or two or more slats) of the second plurality of slats 114a-114c is made substantially of aluminum and is nickel plated. In some embodiments, first side 120a and second side 120b are made of aluminum and are, optionally, nickel plated. In some embodiments, first element 130a, second element 130b, and third element 130c are made of aluminum and are, optionally, nickel plated.

Figure 8:
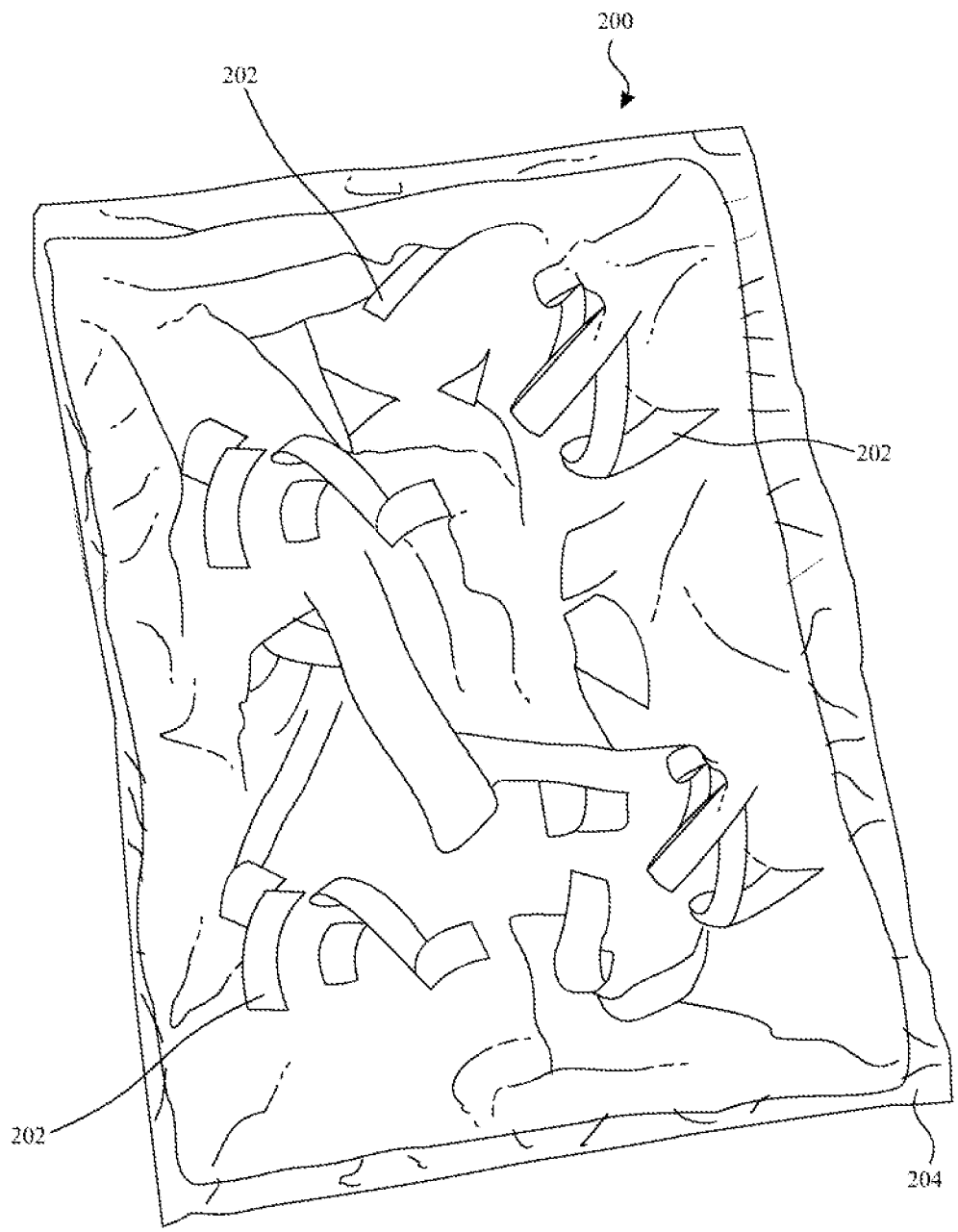
FIG. 8 illustrates an exemplary container including a plurality of static shielding material pieces in accordance with some embodiments.
Figure 9:
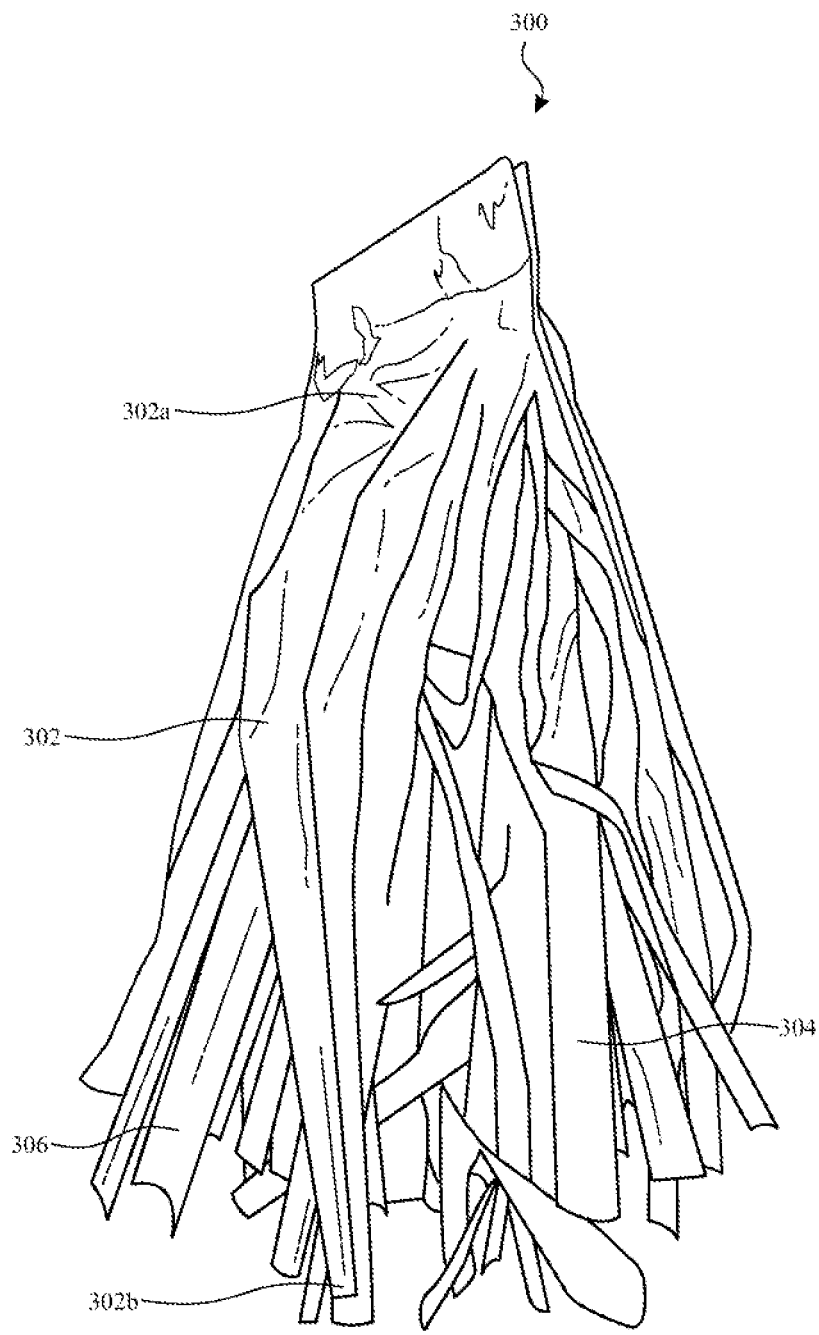
FIG. 9 illustrates an exemplary wave dissipating device in accordance with some embodiments.
Figure 10:
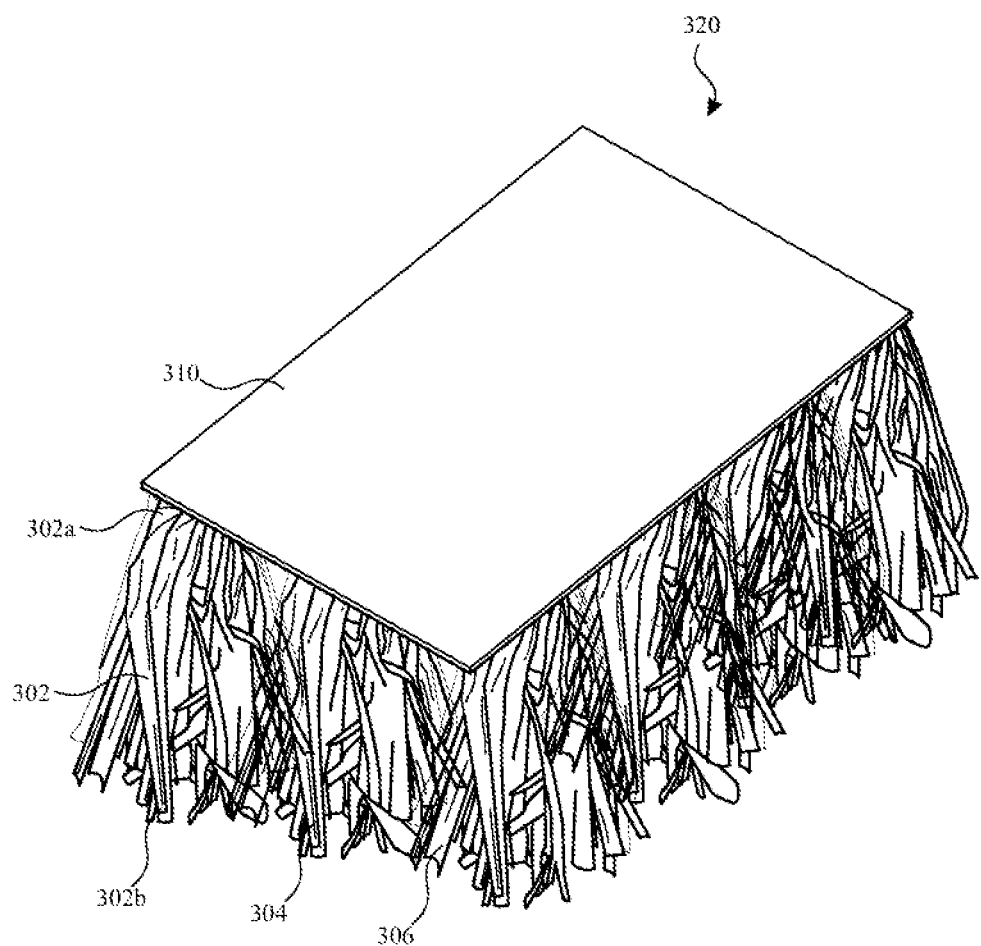
FIG. 10 illustrates an exemplary wave dissipating device in accordance with some embodiments.

In some embodiments, retractable door 110 includes static shielding material. For example, the static shielding material is positioned between the interior door element 112 and the exterior door element 114 of the retractable door 110. The static shielding material is configured to at least partially retract (e.g., into waveguide/cavity regions 140a and 140b) with the retractable door 110. For example, the static shielding containers and devices (e.g., flexible container 200, wave dissipating device 300, wave dissipating device 320) described with respect to one or more of either FIGS. 8, 9, and 10 are positioned between the interior door element 112 and the exterior door element 114 of the retractable door 110.

Static shielding materials are typically multi-layer materials and help to prevent the buildup of static electricity and protect from electrostatic discharge. Two exemplary types of static shielding materials include metal in shielding material and metal out shielding material. In some examples, metal in shielding material has a dissipative low-density polyethylene layer on one side and a 48-gauge polyethylene terephthalate (PET) layer on the side. The metallized side of the PET is adhesive laminated to the polyethylene. In some examples, the surface resistivity of the polyethylene side of the material is approximately 1E11 ohms/square (e.g., 1E10 to 1E12 ohms/square) while the resistivity of the PET side of the material is typically greater than 1E14 ohms/square. In some examples, metal out shielding material has a dissipative PET layer on one side and a protective coating over a metallization layer on the other side. The surface resistance of both sides of the material is generally below 1E12 ohms/square. In some examples, the static shielding material includes a flexible polyester film layer. In some examples, the static shielding material includes a plurality of layers of flexible polyester film. In some examples, the static shielding material includes one or more polyethylene terephthalate layers. In some examples, the static shielding material includes one, two, or more layers of aluminum.

In some embodiments, static shielding material is (e.g., directly or indirectly) attached (e.g., glued) to one or more interior surfaces of the enclosure 100 (e.g., in addition to being positioned in retractable door 110). In some embodiments, the static shielding material is (e.g., directly or indirectly) attached (e.g., glued) to one or more interior surfaces of second chamber 106 of enclosure 100 (e.g., in addition to being positioned in retractable door 110). In some examples, the static shielding material includes one or more layers of flexible polyester film and one or more layers of nylon mesh, wherein the one or more layers of the flexible polyester film is positioned between the nylon mesh and the interior surface of the enclosure.

In some examples, static shielding material is attached (e.g., glued) to one or more of: the interior surface of first side 120a, the interior surface of second side 120b, the interior surface of bottom 120c, the bottom surface of third element 130c, the interior surface (the surface facing the retractable door 110) of backing 120d.

The static shielding material attached to surfaces of the enclosure 100 helps to quickly dissipate electric charges generated on the surfaces of enclosure 100. The static shielding material also increase the surface impedance of the enclosure, enabling any current generated on the inside surface of the enclosure to quickly dissipate. This is an effective and cost efficient technique to reduce internal reflections of radio waves (e.g., WLAN radio waves) inside enclosure 100. The layer of nylon mesh provides durability and helps to prevent devices under test from being scratched or otherwise damaged when the device is being placed into and removed from enclosure 100.

Figure 4:
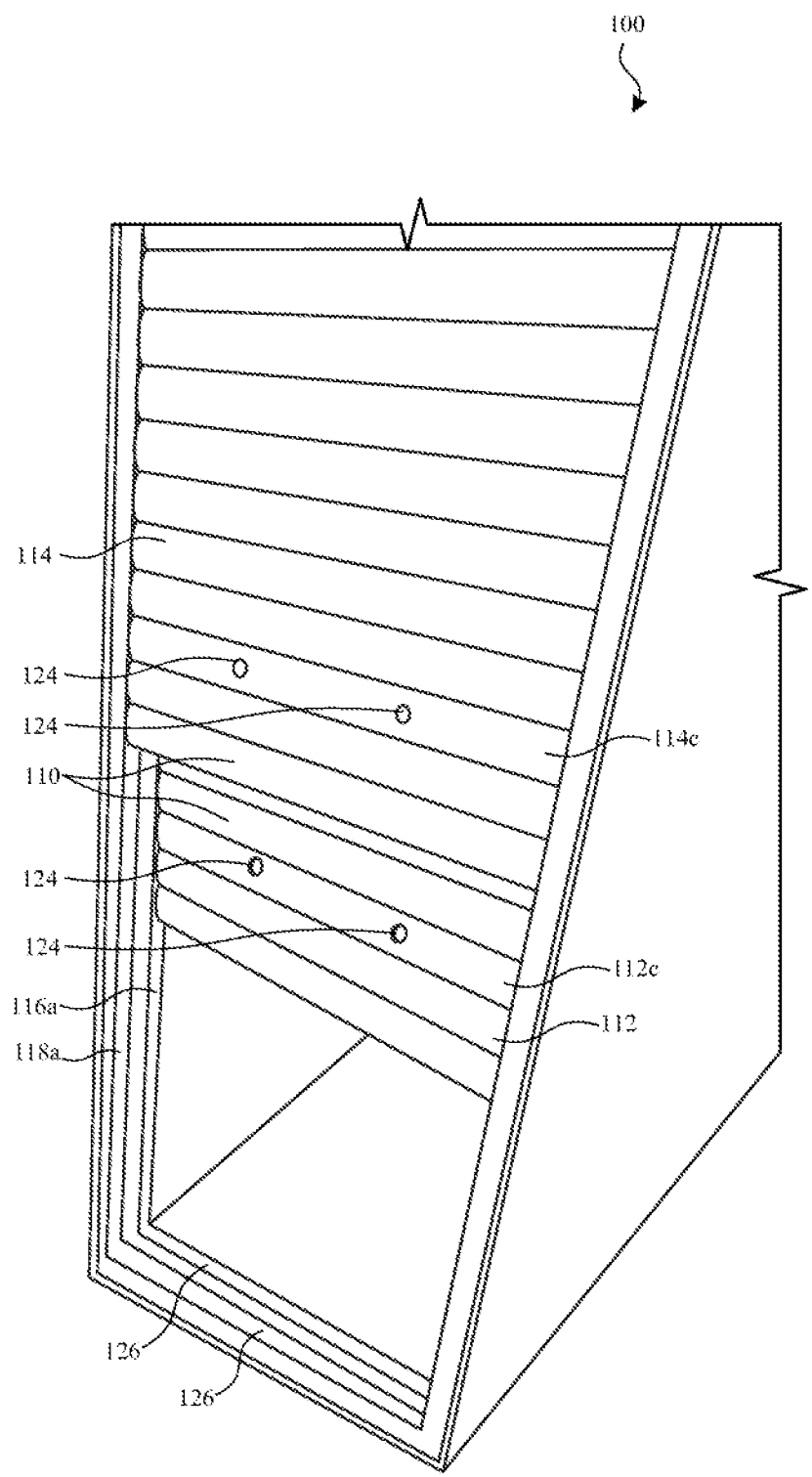
FIG. 4 illustrates a partial view of an exemplary enclosure in accordance with some embodiments.

As illustrated in FIG. 4, the enclosure 100 optionally includes a seal 126 for each of interior door element 112 and the exterior door element 114 of the retractable door 110. The seals 126 are configured to help prevent the entry of radio waves into the enclosure, particularly when the retractable door 110 is closed. In FIG. 4, the interior door element 112 and the exterior door element 114 of the retractable door 110 are show separated for the better understanding of the reader.

Figure 7:
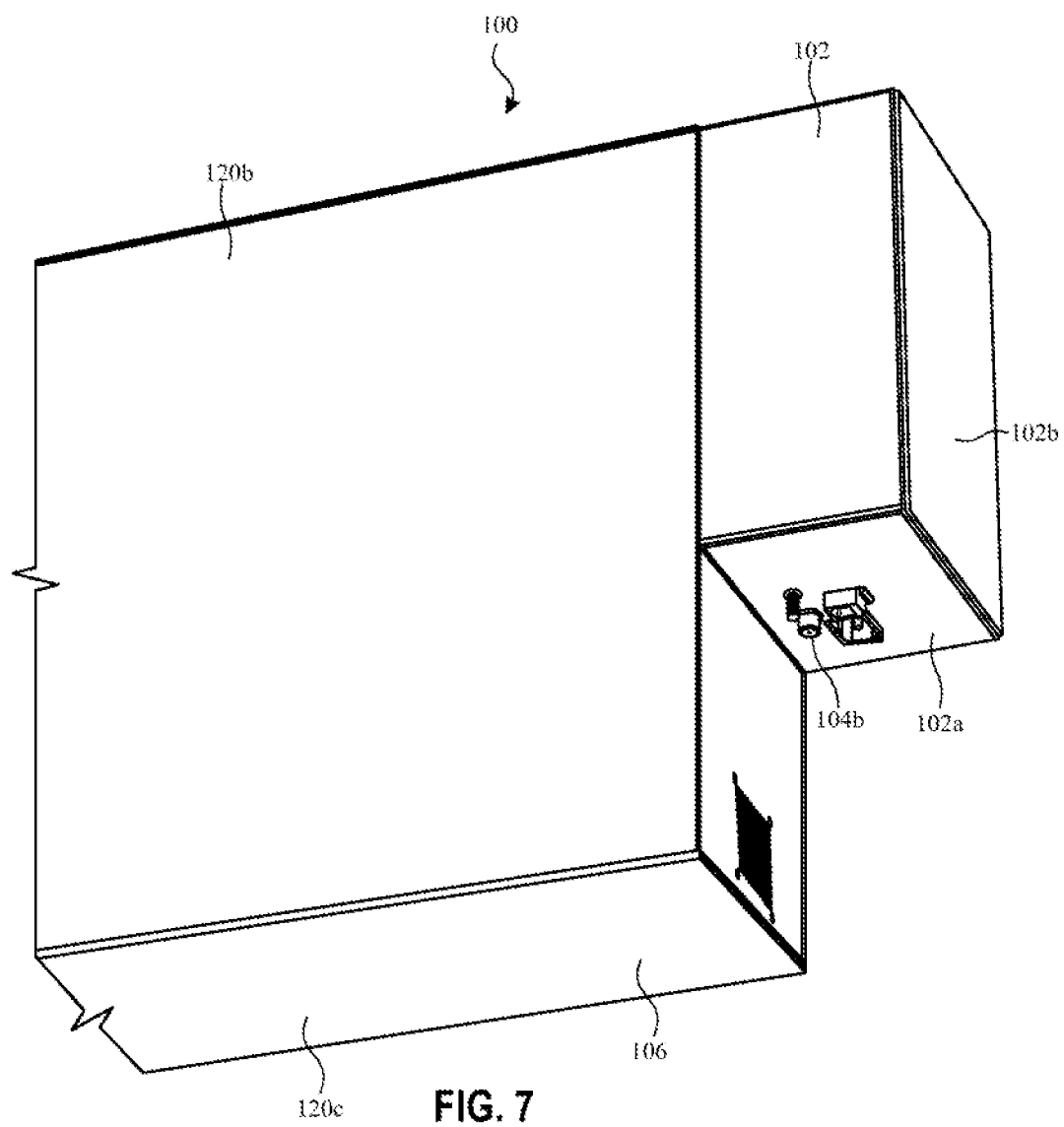
FIG. 7 illustrates a partial view of an exemplary enclosure in accordance with some embodiments.

As illustrated in FIGS. 6 and 7, enclosure 100 optionally includes two chambers: first chamber 102 and second chamber 106. First chamber 102 has a port (e.g., an opening 104a, a receiver socket 104b) that provides a point of connection (e.g., for an electronic cable and/or power cable) or a point of entry (e.g., for an electronic cable and/or power cable, for one or more wires) from outside enclosure 100 to inside enclosure 100. In some examples, first chamber 102 has multiple ports for multiple points of connection or entry. For example, the port (or ports) are configured to receive one or more of an ethernet cable, phone line, RF coax cable, WiFi (WLAN) antenna coax cable, AC power cable, and DC power cable. In some examples, the port(s) provide point(s) of connection, such as receiver sockets, thereby enabling respective cables to be plugged in. In some examples, the port(s) is an opening through which one or more cables enter the first chamber 102. Examples of electronic cables include coax cables and RJ45 cables. Examples of power cables include AC power cables.

In some embodiments, as illustrated in FIG. 6, the port is an opening 104a. Opening 104a provides a point of entry for one or more electronics cables from outside the enclosure 100 to inside the enclosure 100. For example, first chamber 102 has a first surface 102a (e.g., a bottom surface) and a second surface 102b (e.g., a back surface). The first surface 102a has an opening 104a that provides the point of entry from outside the enclosure 100 to inside the enclosure 100. This can be used, for example, to connect a control device located inside enclosure 100 to a computer located outside enclosure 100.

In some embodiments, as illustrated in FIG. 7, the port is a socket 104b. Socket 104b provides a point of connection for one or more electronics cables that are outside the enclosure 100 to cables that are inside the enclosure 100. For example, first chamber 102 has a first surface 102a (e.g., a bottom surface) and a second surface 102b (e.g., a back surface). As illustrated in FIG. 7, the first surface 102a has a port 104b that provides the point of connection from outside the enclosure 100 to inside the enclosure 100. Exemplary ports include coax ports and RJ45 ports.

In some embodiments, the enclosure has multiple ports: openings, sockets, or a combination thereof. Such ports and cables may allow unwanted RF waves to enter enclosure 100, thereby degrading the quality of radio signals inside the enclosure.

To help limit the unwanted RF waves, a container 200, illustrated in FIG. 8, is positioned inside first chamber 102, such as adjacent to the first surface 102a (e.g., adjacent to the opening 104a, adjacent to socket 104b). In some examples, container 200 is flexible. In some examples, the container is not flexible. For example, the flexible container 200 is a bag. Flexible container 200 includes a plurality of static shielding material pieces 202 (e.g., pieces inside the flexible container). Signals and power originating from outside of enclosure 100 pass through first chamber 102 before reaching second chamber 106. For example, a power cable is received through a port (e.g., 104a, 104b) on a first surface 102a of first chamber 102, the power cable passes through first chamber 102 before entering second chamber 106 via port (e.g., 104c) on a second surface of first chamber 102. For another example, a coax cable is received through a port (e.g., 104a, 104b) on a first surface 102a of first chamber 102, the coax cable passes through first chamber 102 before entering second chamber 106 via a second port (e.g., 104c) on a second surface of first chamber 102.

In some embodiments, a cable that enters the first chamber 102 from outside of enclosure 100 via a port is grounded to enclosure 100. For example, the cable includes shielding. In some examples, the cable is grounded to enclosure 100 by electrically connecting the shielding of the cable to first chamber 102 (e.g., using first surface 102a). In some examples, the cable is again grounded to enclosure 100 at two or more locations, such as at a first location adjacent to the port (e.g., 104a, 104b) by which the cable enters the enclosure at first chamber 102 and at a second location adjacent to the port (e.g., 104c) by which the cable enters second chamber 106 from the first chamber 102. Grounding the cable helps to reduce the leakage of stray signals entering first chamber 102 and second chamber 106 via the cable, thereby providing a cleaner signal on the cable.

In some embodiments, flexible container 200 is sealed (e.g., using seal 204 that follows the outer perimeter of flexible container 200) such that the plurality of static shielding material pieces 202 remain in the flexible container 200. For example, flexible container 200 is sealed using heat (heat sealed).

In some embodiments, the flexible container 200 is made of a static shielding material, as described above.

In some embodiments, at least some of the plurality of static shielding material pieces 202 include a flexible polyester film. In some embodiments, the flexible container 200 only includes strips of static shielding material and/or shredded static shielding material, without including other material. In some embodiments, at least some of the plurality of static shielding material pieces 202 include one or more polyethylene terephthalate layers.

In some embodiments, the plurality of static shielding material pieces 202 are not stacked (e.g., are not aligned with sides matching and corners matching) in the flexible container 200. For example, some static shielding material pieces 202 are bent. For another example, some static shielding material pieces 202 are misaligned with each other. For another example, some static shielding material pieces 202 are folded. For another example, the static shielding material pieces 202 have varying shapes and/or sizes (e.g., are not uniform, different pieces are different sizes or shapes).

In some embodiments, the flexible container 200 is a bag that is made of multiple layers, including a flexible polyester film. In some embodiments, the flexible container 200 is a bag made of multiple layers, including one or more polyethylene terephthalate layers.

In some embodiments, the plurality of static shielding material pieces 202 includes a plurality of static shielding strips (e.g., long narrow pieces). In some examples, each strip has uniform width. In some examples, all strips have uniform width. In some examples, strips do not have uniform width (e.g., the width of the strip changes along the length of the strip). In some examples, the width (e.g., average width) of various strips vary. Thus, some strips are wider than other strips. In some examples, the length of various strips vary. Thus, some strips are longer than other strips.

In some embodiments, a length of a first strip of the plurality of static shielding strips is at least double (or 3 times, or 5 times) a width of the first strip, and the length of the first strip is at least double (or 3 times, or 5 times) a height of the first strip. In some embodiments, a length of a second strip of the plurality of static shielding strips is at least double (or 3 times, or 5 times) a width of the second strip, and the length of the second strip is at least double (or 3 times, or 5 times) a height of the second strip.

In some embodiments, the enclosure further includes (e.g., in first chamber 102) a second flexible container (e.g., similar to or identical to 200) positioned adjacent to the first surface 102a (e.g., adjacent to the opening), the second flexible container including a plurality of static shielding material pieces (e.g., with the same or similar characteristics as discussed above with respect to container 200). Optionally, first chamber 102 includes more than two (e.g., five, six) flexible containers 200. In some examples, the flexible containers 200 inside first chamber 102 substantially fill first chamber 102 (e.g., take up more than 50% of the volume of the chamber, take more than 75% of the volume of the chamber). In some examples, one or more (or all) of the cables passing through the first chamber 102 are in direct contact with flexible containers 200 inside first chamber 102. For example, each cable passing through the first chamber 102 is in contact with at least one flexible container 200. In some examples, each interior surface of first chamber 102 (e.g., each of six surfaces of the substantially rectangular box of first chamber 102) is in direct contact with at least one (or two or more) flexible container 200 positioned inside first chamber 102.

In some embodiments, one or more electronics cables enter the enclosure through the opening 104a of the first surface 102a.

FIGS. 9 and 10 illustrate various exemplary devices for dissipating electromagnetic waves, such as radio waves. Wave dissipating devices 300 and 320 each include a plurality of static shielding strips (e.g., made of static shielding material). Each static shielding strip has a respective first end 302a and a respective second end 302b.

By hanging the plurality of static shielding strips inside enclosure 100, the contents of the enclosure (e.g., a device under test) remain easily accessible by hand when door 110 is opened. Further, wave dissipating devices 300 and 320 each provide beneficial wave dissipating characteristics and reduce internal reflections of radio waves (e.g., WLAN radio waves) inside enclosure 100.

The respective first ends (e.g., 302a) of a set of (e.g., some not all, every) strips (e.g., 302-306) of the plurality of static shielding strips are connected (e.g., glued together, glued to a substrate 310 or interior surface of third element 130c). Respective second ends (e.g., 302b) of the set of strips (e.g., 302-306) of the plurality of static shielding strips are not connected (e.g., not connected to each other, not connected to anything). Thus, in some examples, the first ends of the set of strips are not free to reposition with respect to each other while the second ends of the set of strips are free to reposition with respect to each other.

In some embodiments, respective lengths of strips of the set of strips (e.g., 302-306) are at least double (or 3 times, or 5 times) respective widths of the strips, and respective lengths of the strips are at least double (or 3 times, or 5 times) heights of the strips.

In some embodiments, strips (e.g., 302-306) of the plurality of static shielding strips include a layer made of a flexible polyester film. In some embodiments, strips (e.g., 302-306) of the plurality of static shielding strips include one or more polyethylene terephthalate layers.

In some embodiments, the enclosure (e.g., 100) includes a second plurality of static shielding strips (made of static shielding material) separate from the plurality of static shielding strips. For example, the enclosure includes two or more wave dissipating devices 300. For another example, the enclosure includes two or more wave dissipating devices 320. For another example, the enclosure includes one or more wave dissipating devices 300 and one or more wave dissipating devices 320.

In some embodiments, respective first ends of a set of (e.g., some not all, every) strips of the second plurality of static shielding strips are connected (e.g., glued together, glued to a substrate 310), respective second ends of the set of strips of the second plurality of static shielding strips are not connected (e.g., not connected to each other, not glued to the substrate 310, not connected to anything).

In some embodiments, the enclosure further comprises (contains) an antenna of a control device (e.g., a WLAN control device (WLAN terminal), an RFID control device, a short-range communication radio control device, PAN control device). The plurality of static shielding strips (e.g., 300, 320) is positioned (at least partially) between the antenna of the control device and door 110. In some embodiments, the control device includes multiple antennas. For example, the control device may include a wifi (WLAN) antenna and a Bluetooth® antenna. In some examples, enclosure further comprises (contains) the plurality of antennas of the control device. In some examples, enclosure includes at least one of the plurality of antennas of the control device.

In some embodiments, the enclosure 100 includes an electronic device (e.g., a WLAN access point). The electronic device is a device-to-be tested (or a device under test). The electronic device is positioned between the door and the plurality of static shielding strips (e.g., 300, 320).

In some embodiments, one or more of wave dissipating devices 300 and 320 is placed inside first chamber 102, such as by attaching the wave dissipating device 300 or 320 to the interior surface of the top of first chamber 102.

In some examples, the electronic device and the control device are in wireless communication, enabling the electronic device to be accessed or tested for functionality and/or performance.

Accordingly, the various techniques described above enable a test environment inside the enclosure that provides high-quality functionality and performance testing by limiting the entry of wanted radio waves into the enclosure and limiting the reflections of radio waves within the enclosure. As a result, there is no need to use foam materials inside the enclosure to absorb radio waves. Thus, in some embodiments, enclosure 100 does not include foam materials, such as reticulated foam absorbers. In some embodiments, enclosure 100 includes foam materials, such as reticulated foam absorbers to, for example, further limit the reflection of radio waves within the enclosure.

The foregoing description has been described with reference to specific embodiments. However, the illustrative discussions above are not intended to be exhaustive or to limit the invention to the precise forms described. Many modifications and variations are possible in view of the above teachings. Others skilled in the art are thereby enabled to best utilize the techniques and various embodiments with various modifications as suited to various uses.

Although the disclosure and examples have been described with reference to the accompanying drawings, it is to be noted that various changes and modifications will become apparent to those skilled in the art. Such changes and modifications are to be understood as being included within the scope of the disclosure.

What is claimed is:

1. An enclosure for testing electronic devices, the enclosure comprising:
   a plurality of static shielding strips, each static shielding strip having a respective first end and a respective second end;
   wherein respective first ends of a set of strips of the plurality of static shielding strips are connected;
   wherein respective second ends of the set of strips of the plurality of static shielding strips are not connected; and
   wherein strips of the plurality of static shielding strips include one or more polyethylene terephthalate layers.

2. The enclosure of claim 1, wherein respective lengths of strips of the set of strips are at least double respective widths of the strips, and respective lengths of the strips are at least double heights of the strips.

3. The enclosure of claim 1, wherein strips of the plurality of static shielding strips include a layer of flexible polyester film.

4. The enclosure of claim 1, further comprising:
a second plurality of static shielding strips separate from the plurality of static shielding strips;
wherein respective first ends of a set of strips of the second plurality of static shielding strips are connected; and
wherein respective second ends of the set of strips of the second plurality of static shielding strips are not connected.

5. The enclosure of claim 1, further comprising:
an antenna of a control device;
a door; and
wherein the plurality of static shielding strips is positioned between the antenna of the control device and the door.

6. The enclosure of claim 5, further comprising:
an electronic device, where the electronic device is a device-to-be tested; and
wherein the electronic device is positioned between the door and the plurality of static shielding strips.

7. The enclosure of claim 6, wherein the electronic device and the control device are in wireless communication.

8. The enclosure of claim 1, wherein the respective first ends of the set of strips of the plurality of static shielding strips are connected to a substrate.

9. The enclosure of claim 8, wherein the substrate is a surface of the enclosure.

10. The enclosure of claim 1, further comprising:
static shielding material attached to one or more interior surfaces of the enclosure.

11. An enclosure for testing electronic devices, the enclosure comprising:
a plurality of static shielding strips, each static shielding strip having a respective first end and a respective second end;
wherein respective first ends of a set of strips of the plurality of static shielding strips are connected;
wherein respective second ends of the set of strips of the plurality of static shielding strips are not connected;
a second plurality of static shielding strips separate from the plurality of static shielding strips;
wherein respective first ends of a set of strips of the second plurality of static shielding strips are connected; and
wherein respective second ends of the set of strips of the second plurality of static shielding strips are not connected.

12. The enclosure of claim 11, wherein respective lengths of strips of the set of strips are at least double respective widths of the strips.

13. The enclosure of claim 11, wherein strips of the plurality of static shielding strips include a layer of flexible polyester film.

14. The enclosure of claim 11, further comprising:
an antenna of a control device;
a door; and
wherein the plurality of static shielding strips is positioned between the antenna of the control device and the door.

15. The enclosure of claim 14, wherein strips of the plurality of static shielding strips include one or more polyethylene terephthalate layers.

16. An enclosure for testing electronic devices, the enclosure comprising:
a plurality of static shielding strips, each static shielding strip having a respective first end and a respective second end;
wherein respective first ends of a set of strips of the plurality of static shielding strips are connected;
wherein respective second ends of the set of strips of the plurality of static shielding strips are not connected;
an antenna of a control device;
a door; and
wherein the plurality of static shielding strips is positioned between the antenna of the control device and the door.

17. The enclosure of claim 16, wherein respective lengths of strips of the set of strips are at least double respective widths of the strips.

18. The enclosure of claim 16, wherein strips of the plurality of static shielding strips include a layer of flexible polyester film.

19. The enclosure of claim 16, wherein the respective first ends of the set of strips of the plurality of static shielding strips are connected to a substrate.

20. The enclosure of claim 16, wherein strips of the plurality of static shielding strips include a layer of flexible polyester film.

* * * * *